(12) United States Patent
Inagaki et al.

(10) Patent No.: US 8,679,732 B2
(45) Date of Patent: Mar. 25, 2014

(54) METHOD FOR REMOVING RESIST AND FOR PRODUCING A MAGNETIC RECORDING MEDIUM, AND SYSTEMS THEREOF

(75) Inventors: Joe Inagaki, Odawara (JP); Hiroyuki Matsumoto, Chigasaki (JP); Kazuhiko Hasegawa, Kanagawa-ken (JP)

(73) Assignee: HGST Netherlands B.V., Amsterdam (NL)

( * ) Notice: Subject to any disclaimer, the term of this patent is extended or adjusted under 35 U.S.C. 154(b) by 354 days.

(21) Appl. No.: 12/820,008

(22) Filed: Jun. 21, 2010

(65) Prior Publication Data

US 2010/0328809 A1    Dec. 30, 2010

(30) Foreign Application Priority Data

Jun. 24, 2009  (JP) .................. 2009-149760

(51) Int. Cl.
    *G03F 7/42*     (2006.01)
(52) U.S. Cl.
    USPC .............................. 430/320; 134/1
(58) Field of Classification Search
    None
    See application file for complete search history.

(56) References Cited

U.S. PATENT DOCUMENTS

| | | | | |
|---|---|---|---|---|
| 6,143,473 | A | * | 11/2000 | Hoshino et al. ............... 430/296 |
| 6,533,902 | B1 | * | 3/2003 | Miki et al. ............... 204/157.15 |
| 2004/0154743 | A1 | * | 8/2004 | Savas et al. ............... 156/345.5 |
| 2008/0248333 | A1 | * | 10/2008 | Moriwaki et al. ............ 428/817 |
| 2009/0011367 | A1 | * | 1/2009 | Omatsu et al. ............. 430/287.1 |
| 2009/0218313 | A1 | * | 9/2009 | Kajiwara et al. ................ 216/22 |

FOREIGN PATENT DOCUMENTS

| | | |
|---|---|---|
| JP | 61-027635 | 2/1986 |
| JP | 61-077852 | * 4/1986 |
| JP | 61-108135 | * 5/1986 |
| JP | 63-266825 | 11/1988 |
| JP | 04-309223 | 10/1992 |
| JP | 06-177093 | * 6/1994 |
| JP | 06-244098 | 9/1994 |
| JP | 08-082790 | 3/1996 |
| JP | 09-281716 | 10/1997 |
| JP | 10-163178 | 6/1998 |
| JP | 11-097418 | * 4/1999 |
| JP | 2000-178777 | 6/2000 |
| JP | 2001-100021 | 4/2001 |
| JP | 2002-212779 | 7/2002 |
| JP | 2002-223036 | 8/2002 |
| WO | 2009/051272 | * 4/2009 |

OTHER PUBLICATIONS

Iso et al., "Study on UV/O3 Cleaning by Xe2* Excimer Lamp," Journal of the Illuminating Engineering Institute of Japan, vol. 83, No. 5, 1999, pp. 273-277.

* cited by examiner

Primary Examiner — Martin Angebranndt
(74) Attorney, Agent, or Firm — Zilka-Kotab, PC

(57) ABSTRACT

In one embodiment, a method for removing a resist includes irradiating, with an UV light having a wavelength of less than about 240 nm, a structure having a resist on a pattern surface in an atmosphere having oxygen. The resist is used as a mask as it remains above the pattern after the pattern has been transferred to a magnetic recording medium surface having a magnetic film thereon, and the irradiating is performed during production of the magnetic recording medium. In another embodiment, a method for forming a magnetic recording medium includes applying a resist to a surface of a magnetic film above a substrate, curing the resist by irradiating the resist with first UV light to form a pattern, transferring the pattern to the magnetic film using the pattern, and removing the resist by irradiating using second UV light having a shorter wavelength in an atmosphere including oxygen.

17 Claims, 6 Drawing Sheets

Charts show from left to right:

Exemplary Embodiment 1

Exemplary Embodiment 2

Comparative Example 1

Comparative Example 2

Comparative Example 5

Charts show from left to right:

Exemplary Embodiment 1

Exemplary Embodiment 2

Comparative Example 1

Comparative Example 2

Comparative Example 5

METHOD FOR REMOVING RESIST AND FOR PRODUCING A MAGNETIC RECORDING MEDIUM, AND SYSTEMS THEREOF

RELATED APPLICATIONS

The present application claims priority to a Japanese Patent Application filed Jun. 24, 2009, under Appl. No. 2009-149760, which is incorporated herein by reference.

FIELD OF THE INVENTION

The present invention relates to a method for removing a resist layer, which is suitable for use in the production of a magnetic recording medium in which a pattern is formed, and systems thereof.

BACKGROUND OF THE INVENTION

In recent years, hard disk devices have come to be installed not only in PCs and network servers, but also in consumer electronic appliances, car navigation systems, personal music players, etc., and there is a strong demand for these devices to become quicker and to have a greater capacity. In order to achieve a surface recording density of more than 1 terabit per square inch (around 645.16 square millimeters), it is necessary to improve the stability of the recorded magnetic information to fluctuations in heat. To achieve this, in the situation where conventional media has a flat and continuous shape in the track direction, development has progressed into discrete track-type magnetic recording media in which grooves are formed between tracks to isolate the magnetic recording signals, and bit pattern-type magnetic recording media for magnetic recording onto isolated magnetic particles. Pattern transfer and processing technologies which are employed in methods for producing conventional magnetic heads and semiconductors are applied to the structures of magnetic recording media for which a pattern is formed. In the case of magnetic recording media for hard disk purposes, the magnetic head floats at a spacing of no more than 10 nm, in addition to the abovementioned technology, and technology is used in order to finish the surface of the magnetic media which has undergone pattern processing such that it is smooth, clean, and does not interfere with the floating head.

Japanese Unexamined Patent Application Pub. Nos. H4-309223 and H8-82790 relate to a semiconductor chip and a color filter for a liquid crystal display panel, and these documents disclose a resist removal method in which the resist is removed by ultra-violet (UV) light irradiation employing a low-pressure mercury lamp.

The resist removal method carried out using UV irradiation using a low-pressure mercury lamp requires UV radiation under an ozone atmosphere and high-temperature heating conditions of at least 100° C. in order to promote removal of the whole resist. The effect for removing the resist residue increases in proportion to the ozone gas concentration and the heating temperature, and therefore a high concentration of ozone gas is needed. However, in the case of magnetic recording media, there is a deterioration in the magnetic characteristics during this process, and therefore it is undesirable to expose such media to heating at high temperatures of more than 100° C. and high concentrations of ozone gas. Furthermore, there are limitations to the process, such as that the object from which the resist is being removed can only have the resist removed from the openings fig electrode formation and the unneeded parts outside of the pixels of the color filter, and these methods are not designed for completely removing the resist and carrying out clean processing. This means that such methods may be applied to magnetic recording media, but it is not possible to achieve an adequate removal of the resist residue.

Furthermore, it is desirable to have the head float at a spacing of no more than about 10 nm over the whole surface of the hard disk, and therefore the whole of the surface of the magnetic disk where the pattern is formed needs to be processed uniformly and cleanly, unlike in semiconductor production processes. Therefore, there is a need for a design that includes an alternative method in which the resist residue is removed without any damage to the magnetic film, and the magnetic characteristics and the floating reliability after completion are not adversely affected.

SUMMARY OF THE INVENTION

In one embodiment, a method for removing a resist includes irradiating, with an UV light having a wavelength of less than about 240 nm, a structure having a resist on a surface of a pattern in an atmosphere having oxygen. The resist is used as a mask as it remains above the pattern after the pattern has been transferred to a surface of a magnetic recording medium having a magnetic film thereon, and the irradiating is performed during production of the magnetic recording medium for which the pattern is formed.

In another embodiment, a method for forming a magnetic recording medium includes applying a resist to a surface of a magnetic film above a substrate, curing the resist by irradiating the resist with first UV light to form a pattern, transferring the pattern to the magnetic film using the pattern, and removing the resist by irradiating using second UV light having a shorter wavelength than the first UV light in an atmosphere including oxygen.

Any of these embodiments may be implemented in a magnetic data storage system such as a disk drive system, which may include a magnetic head, a drive mechanism for passing a magnetic medium (e.g., hard disk) over the magnetic head, and as controller electrically coupled to the magnetic head.

Other aspects and advantages of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and or as defined in dictionaries, treatises, etc.

It must also be noted that, as used in the specification and the appended claims, the singular forms "a," "an" and "the" include plural referents unless otherwise specified.

According to one embodiment, the problems described previously can be avoided by providing a method for removing a negative resist which can be applied to processes for mass producing hard disks when there is a requirement for production volumes of several hundred disks per hour or more on one production line.

Figure 5:
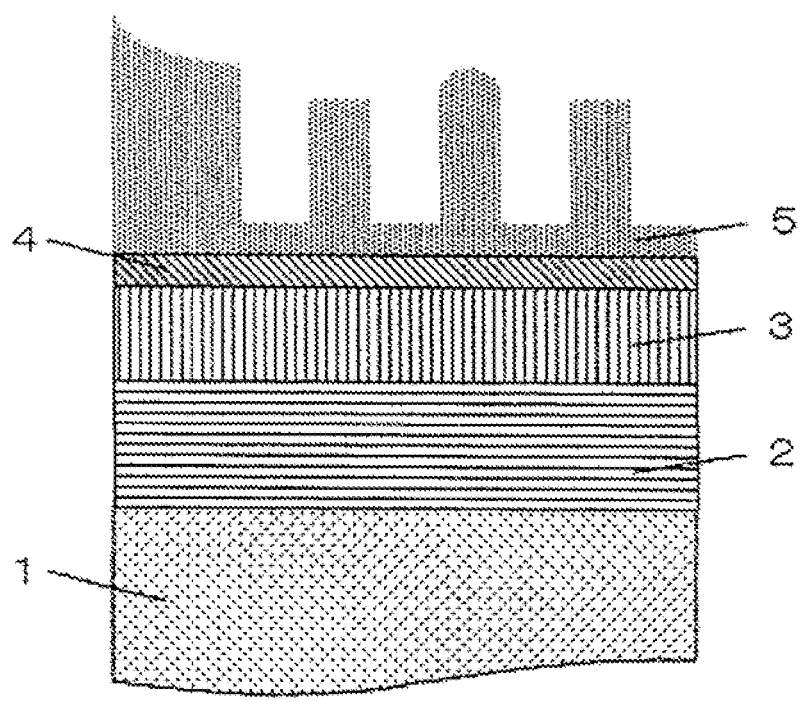
FIG. 5 is a schematic in cross section showing one stage it the production of a magnetic recording medium according to one embodiment.
Figure 6:
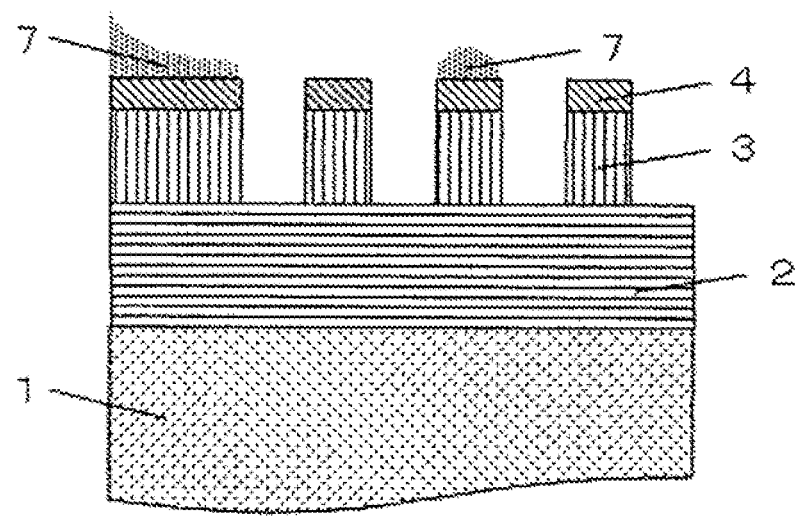
FIG. 6 is a schematic in cross section showing one stage in the production of a magnetic recording medium according to one embodiment.
Figure 7:
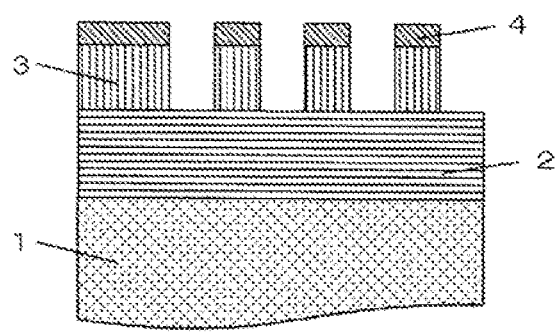
FIG. 7 is a schematic in cross section showing one stage in the production of a magnetic recording medium according to one embodiment.

An example of a method for producing a magnetic recording medium for which a pattern is formed is described in relation to a method for producing a discrete track-type magnetic recording medium. In one approach, a pattern created on a mold (stamper) through use of an imprint device is transferred to a hard disk as an imprint resist pattern (this is a negative-type resist, and therefore it is referred to below as a negative resist). The negative resist is cured by polymerization using ultraviolet (UV) radiation during the transfer. As shown in FIG. 5, the transferred negative resist may be used as a mask, and the pattern is transferred to the disk through use of a dry etching process, such as reactive ion etching, ion milling, etc. FIG. 7 shows, in one embodiment, the state after the pattern transfer has been carried out in an ideal manner. In actuality, as shown in FIG. 6 according to one embodiment, the negative resist remaining over the whole surface or locally (referred to below as the resist residue) may be completely removed after the pattern has been transferred. Reactive etching employing, oxygen gas is conventionally used as a standard method for removing the negative resist which has been cured by UV radiation, but the methods disclosed herein are not so limited. However, when this method is used to remove the resist residue on the magnetic recording medium, not only is the resist residue removed, but the magnetic film in which the pattern is formed is also damaged, and therefore it is not possible to carry out a normal transfer with a pattern width of more than 100 nm over the whole surface of a hard disk, something which is a requirement for discrete track-type magnetic recording media.

In one general embodiment, a method for removing a resist includes irradiating, with an UV light having a wavelength of less than about 240 nm, a structure having a resist on a surface of a pattern in an atmosphere having oxygen. The resist is used as a mask as it remains above the pattern after the pattern has been transferred to a surf cc of a magnetic recording medium having a magnetic film thereon, and the irradiating is performed during production of the magnetic recording medium for which the pattern is formed.

In another general embodiment, a method for forming a magnetic recording medium includes applying a resist to a surface of a magnetic film above a substrate, curing the resist by irradiating, the resist with first UV light to form a pattern, transferring the pattern to the magnetic film using the pattern, and removing the resist by irradiating using second UV light having a shorter wavelength than the first UV light in an atmosphere including oxygen.

In one embodiment, a pattern surface may be irradiated with excimer UV light having a wavelength of no more than 240 nm under an oxygen-containing atmosphere, such as air, in order to remove a negative resist remaining after the pattern has been transferred. Furthermore, cleaning may be carried out using pure water after the excimer UV light irradiation.

The decomposition of the resist residue by excimer UV light irradiation progresses in the atmosphere, and therefore it is unnecessary to introduce ozone gas. The ozone concentration when the excimer UV light is irradiated can be kept to $\frac{1}{10}$-$\frac{1}{100}$ of the 4000 ppm to 10,000 ppm disclosed in Japanese Unexamined Patent Application Pub. No. H8-82790, for example, and therefore there is no deterioration of the magnetic characteristics of the magnetic film.

Excimer UV light irradiation has many advantages over conventionally used radiation. For example, it can be carried out under atmospheric pressure in the atmosphere, it can be carried out at low temperature without the need to heat the substrate, it can be carried out in a short time with strong energy, and the substrate is not damaged because of chemical reactions produced by the UV light. In addition, the excimer UV lamp employs a high-frequency, high-voltage dielectric barrier, and so it does not require time to start up, and therefore it is possible to repeatedly switch the lamp on and off in an instant, and the lamp is highly efficient because the energy is irradiated at a single wavelength, e.g., light having a long wavelength, which causes temperature increases whey it is irradiated, then the lamp is switched off such that it is not irradiated, and so the surface temperature of the object being irradiated does not increase for the most part. Consequently, in one embodiment, a method is presented for removing a negative resist, which can be applied to the production of a magnetic recording medium for which a pattern needs to be formed, such as a discrete track-type magnetic recording medium or a bit pattern-type magnetic recording medium which is suitable for high-density magnetic recording.

The methods disclosed herein, in various embodiments, make it possible to remove the negative resist in a short time, and therefore it can be applied to processes for mass producing hard disks wherein there is a requirement for production volumes of several hundred disks per hour or more on one production line. The method for removing a negative resist, according to one embodiment, can be employed for magnetic recording disks in general which are installed in hard disk devices. The methods may also be utilized in various fields, such as optical magnetic recording, heat-assisted magnetic recording which makes use of both magnetism and heat, and microwave-assisted magnetic recording which makes use of both magnetism and microwaves. Furthermore, when the methods disclosed herein are combined with a dry etching device or a cleaning device, it is possible to safely detach the negative resist simply and in a short time, and it is possible to adopt a system for mass production facilities. The methods may also be applied to cleaning of the mold (stamper) of an imprint device, among other things.

The oxygen absorption coefficient in the light irradiation employing the excimer UV lamp is increased by up to 100 times compared with the case in which a well-known low-pressure mercury UV lamp (254 nm) is used for UV/ozone cleaning, and reactive oxygen species (radicals) are produced at high density. Furthermore, the photon energy increases, and therefore there is a high capacity for cleaving organic bonds. Reactive oxygen species O ($^1$D) act on organic substances in which the chemical bonds have been cleaved, and the organic substances undergo oxidative decomposition (carbonization reaction), forming low-molecular-state material, which is removed, as shown by Equation 1.

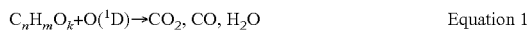
$$C_nH_mO_k + O(^1D) \rightarrow CO_2, CO, H_2O \quad \text{Equation 1}$$

For example, according to "Study on UV/O$_3$ cleaning by Xe$_2$ excimer lamp" Journal of the Illuminating Engineering Institute of Japan, VOL. 83, No. 5 (Apr. 25, 1999), in the case of a conventional low-pressure mercury lump, ozone O$_3$ is required for the production of reactive oxygen species O ($^1$D) which act on and remove the resist residue, as shown in Equation 2.

$$O_3 + h\nu(254 \text{ nm}) \rightarrow O(^1D) + O_2 \quad \text{Equation 2}$$

In order to completely remove the resist residue, light irradiation under an ozone atmosphere is necessary, and it has been confirmed that a light irradiation time at least 10 times greater than in the case of an excimer UV lamp is necessary.

On the other hand, when an excimer UV lamp, for example xenon (172 nm) is used reactive oxygen species O ($^1$D) are produced directly from the oxygen O$_2$ in the atmosphere, as shown in Equation 3 and 4. In addition, even if ozone O$_3$ is produced at the same time, O ($^1$D) is immediately produced, and therefore it is possible to keep the ozone concentration to at the same time as reactive oxygen species are produced at high density.

$$O_2 + h\nu(172 \text{ nm}) \rightarrow O(^1D) + O(^3P) \quad \text{Equation 3}$$

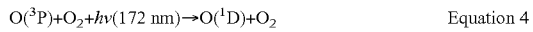
$$O(^3P) + O_2 + h\nu(172 \text{ nm}) \rightarrow O(^1D) + O_2 \quad \text{Equation 4}$$

Furthermore, in the case of an excimer UV lamp, even if the light irradiation time is extremely short, the resist residue can be completely removed by subsequent washing with pure water. That is to say, excimer UV irradiation in which the photon energy exceeds the energy of the bonds of the organic substances makes it possible for the chemical bonds of the organic negative resist to be cleaved from the surface in the film thickness direction to the negative resist transfer surface by light irradiation on one occasion, and therefore the resist residue can be completely removed by the subsequent washing with pure water. On the other hand, in the case of a low-pressure mercury lamp, the photon energy is low, and therefore the resist residue cannot be cleaved in the film thickness direction by light irradiation on one occasion, and only the resist residue on the surface layer part can be removed by washing with pure water after the light irradiation.

With the method for producing a magnetic recording medium for which a pattern is formed, the cured resist residue can be decomposed and easily removed by irradiation of excimer UV light at a wavelength of about 240 nm or less onto a sample from close range. In addition, when this is combined with washing, with pure water after the irradiation of excimer UV light, it is possible to provide a cleaner finished surface and to remove the resist residue in a shorter time, according to some preferred embodiments.

Figure 2:
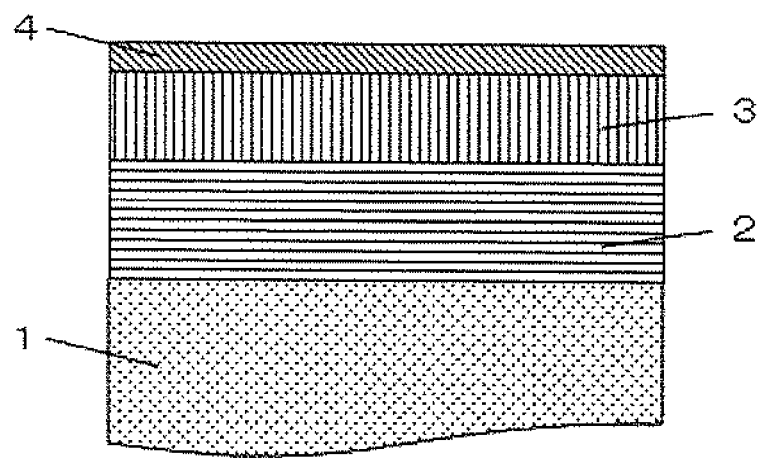
FIG. 2 is a schematic in cross section showing one stage in the production of a magnetic recording medium according to one embodiment.
Figure 3:
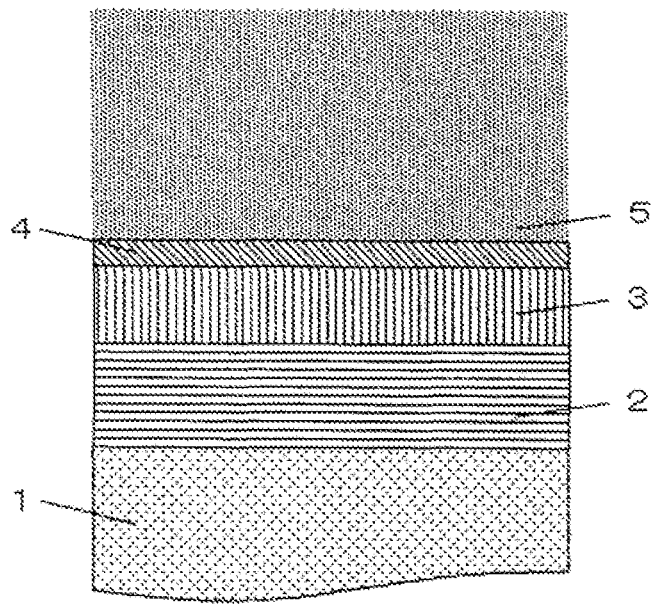
FIG. 3 is a schematic in cross section showing one stage in the production of a magnetic recording medium according to one embodiment.
Figure 4:
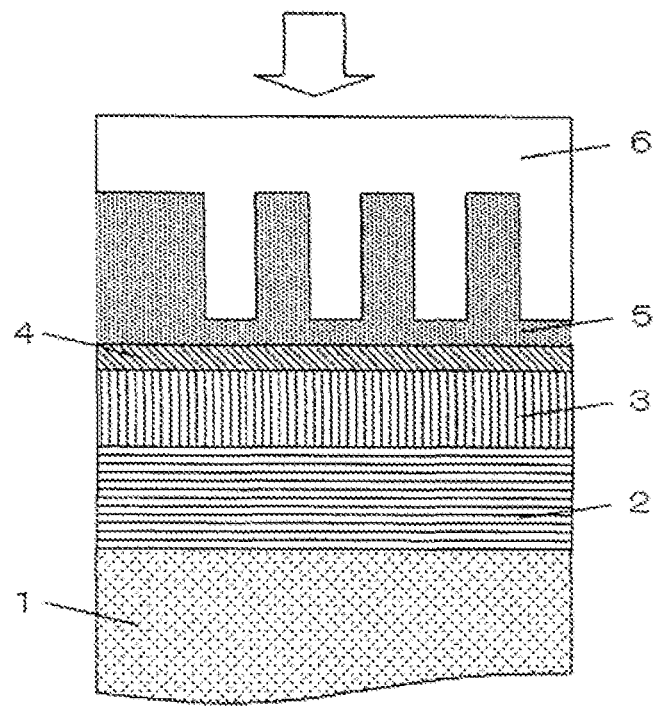
FIG. 4 is a schematic in cross section showing one stage in the production of a magnetic recording, medium according to one embodiment.

A discrete track-type magnetic recording medium was produced by the following method, in one embodiment. Using a sputtering device, as shown in FIG. 2, an intermediate film 2 and magnetic films 3, 4 were formed on a glass substrate 1, and a perpendicular magnetic recording medium having a multilayer film structure (referred to below as a hard disk) was produced. Of course, any substrate material as would be known to one of skill in the art may be used. The uppermost surface of the hard disk shown in FIG. 2 was a magnetic film, and a disk having a protective film made of carbon, silicon, etc., was also produced at the same time. Next, using a resist application device, a negative resist 5 was uniformly applied to the surface of the hard disk, as shown in FIG. 3, and a discrete track pattern was transferred onto the hard disk by means of a mold (stamper) 6 of an imprint device such as that shown in FIG. 4. When the pattern was transferred, UV light of wavelength 365 nm was irradiated across the quartz mold using a low-pressure mercury lamp, and the negative resist 5 was polymerized and subjected to UV curing, after which the stamper 6 was detached and the pattern was formed. The width of the pattern formed was produced in a range of about 50 nm-1000 nm. The mean film thickness of the negative resist after the transfer was approximately 70 nm, and samples were produced in a range of about 1 nm-100 nm.

In this process, as shown in FIG. 5, the film thickness of the negative resist 5 was uneven at the outer periphery of the hard disk, and the negative resist had thickly adhered in places. In this state, using the negative resist as a mask, the pattern was transferred to the disk by means of reactive ion etching or ion milling, and resist residue 7 remained, as shown in FIG. 6.

The method shown in Table 1 was employed in order to remove the resist residue 7. Removal of the negative resist was confirmed using a contact angle meter to measure the contact angle of the samples with dripped pure water. When the contact angle was 4° or less, it was considered that the resist residue had been removed, in one approach. The time until the contact angle was measured after light irradiation or washing, was set at about 5-10 minutes. Furthermore, an optical microscope and a fault detector employing scattered laser light were used to evaluate, the resist residue.

TABLE 1

| | Resist detachment method | UV wavelength | Atmosphere | Cleaning conditions | Positive resist | Negative resist |
|---|---|---|---|---|---|---|
| Ex. Emb. 1 | excimer UV + atmosphere | 172 nm | atmosphere | — | ⊙ | ⊙ |
| Ex. Emb. 2 | excimer UV + atmosphere | 172 nm | atmosphere | pure water + ultrasonic waves | ⊙ | ⊙ |

TABLE 1-continued

| | Resist detachment method | UV wavelength | Atmosphere | Cleaning conditions | Positive resist | Negative resist |
|---|---|---|---|---|---|---|
| Comp. Ex. 1 | UV + ozone | 254 nm | ozone | — | Δ | Δ |
| Comp. Ex. 2 | UV + atmosphere | 254 nm | atmosphere | — | O | X |
| Comp. Ex. 3 | UV irradiation only | 254 nm | vacuum | — | X | X |
| Comp. Ex. 4 | UV + ozone | 365 nm | ozone | — | O | X |
| Comp. Ex. 5 | ozone gas only | — | ozone | — | X | X |
| Comp. Ex. 6 | ozone water | — | — | pure water + ozone water + ultrasonic waves | O | X |
| Comp. Ex. 7 | organic solvent | — | — | NMP (100%) | ⊙ | X |
| Comp. Ex. 8 | organic solvent | — | — | DMSO (60%) + NMP (40%) | Δ | X |
| Comp. Ex. 9 | organic solvent | — | — | AH (60%) + Phenol (20%) + ABS (20%) | Δ | X |
| Conv. Meth. 1 | oxygen ashing | — | oxygen | — | Δ | Δ |
| Conv. Meth. 2 | sulfuric acid + hydrogen peroxide | — | — | pure water + sulfuric acid + hydrogen peroxide + ultrasonic waves | Δ | Δ |

In Table 1, Ex Emb.=Exemplary Embodiment; Comp. Ex.=Comparative Example; Conv. Meth.=Conventional Method. Also, ⊙: completely detached; O: partly detached; Δ: damage present; and X: detachment not possible FIG. 1 shows Exemplary Embodiments 1 and 2, wherein excimer UV light of wavelength 172 nm is irradiated onto the pattern surface of a magnetic recording medium wider an oxygen-containing atmosphere such as the atmosphere, in order to remove the negative resist remaining after the pattern has been transferred, according to two embodiments.

Figure 8:
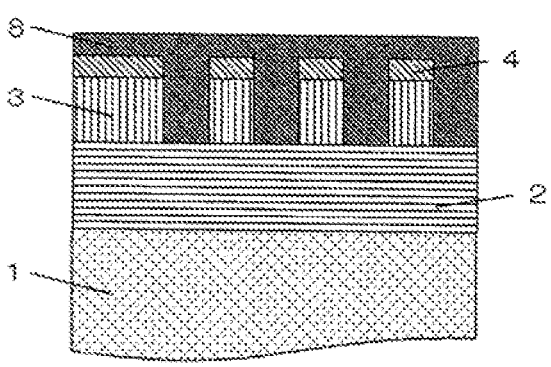
FIG. 8 is a schematic in cross section showing one stage in the production of a magnetic recording medium according to one embodiment.

FIG. 7 shows an ideal hard disk in which the discrete track processing has been completed and the negative resist has been detached, in one embodiment. The negative resist on the magnetic film 4 has been completely removed. The areas between the discrete track troughs were then refilled with carbon or the like, after which the surface unevenness was removed by means of ion beam etching or the like, and sputtering or another process was used to produce a carbon protective film 8, so that a hard disk having a smooth surface was produced, as shown in FIG. 8. A lubricant was then applied to the surface of the carbon protective film 8, and the floating stability of the magnetic head was evaluated.

According to several embodiments, any of the methods described, herein may produce structures which may be used in disk drive systems. For example, a disk drive system may include a magnetic recording medium formed using any of the techniques described, herein, at least one magnetic head for writing to the magnetic recording medium, a slider for supporting the at least one magnetic head, and a control unit coupled to the at least one magnetic head for controlling operation of the at least one magnetic head. Of course, more components of the disk drive system may be present, and many different embodiments may be followed in forming the magnetic recording medium.

Figure 1:
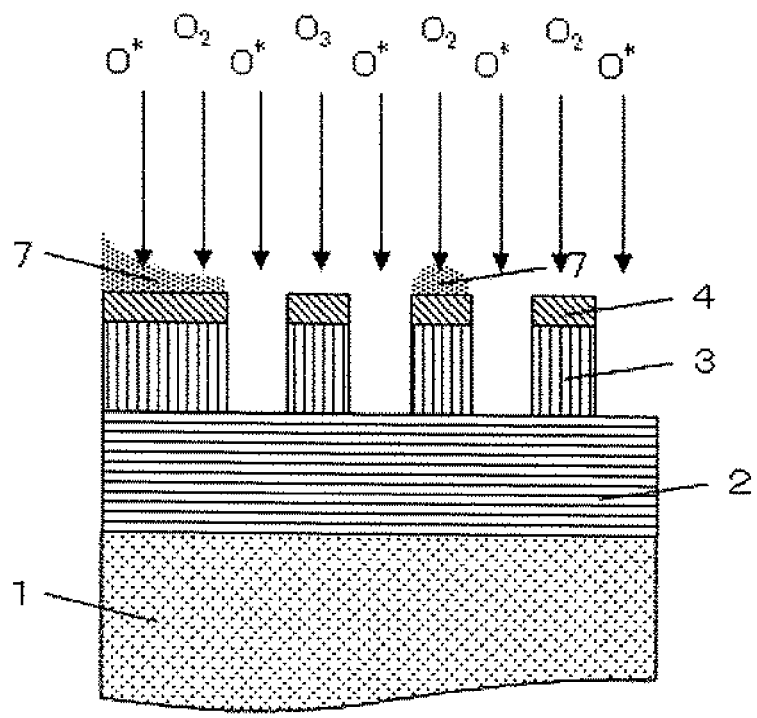
FIG. 1 illustrates one stage of the method for removing a resist residue according to one embodiment.

As shown in FIG. 1, it was discovered that the negative resist could be decomposed and easily removed by irradiating the sample, in which the pattern had been transferred to the hard disk by the negative resist, with excimer UV light of wavelength no more than 240 nm for 5 minutes under atmospheric conditions, at close range (distance from the lamp no more than 2 mm). In Exemplary Embodiments 1 and 2, an excimer UV lamp of wavelength 172 nm employing xenon gas (Xe) was used, but the same effect as in Exemplary Embodiments 1 and 2 may be achieved with other excimer UV lamps, including ArBr (165 nm), KrI (191 nm), or KrCl (222 nm). However, the same effect could not be achieved with XeI of wavelength 253 nm. The reason for the different effects depending on the wavelength is thought to be because when the wavelength, of UV light is about 240 nm or less, the oxygen in the air decomposes to produce ozone. Accordingly, when UV light of wavelength 240 nm or less is irradiated in the manner described above, it is possible to demonstrate such an effect.

Light irradiation was carried out with the distance between the excimer UV lamp and the surface of the sample set at about 0.1 mm-7 mm, and although it was confirmed that the negative resist had been removed, the time taken until the negative resist had been completely removed suddenly became longer together with the distance, and therefore this distance is preferably no more than about 3 mm. Furthermore, the sample was placed on a rotating sample base and irradiated with light from a distance of about 3 mm or less while being rotated at about 0 rpm to 300 rpm. In this case, the rotation causes the photons produced by the light irradiation to act uniformly over the whole surface of the sample, and therefore the time until the negative resist is completely removed is shortened. It was confirmed that the negative resist after the transfer had been completely removed in a film thickness range of about 1 nm to 100 nm.

It was also discovered that the residue can be completely removed by the subsequent washing with pure water even if the excimer UV light irradiation time is short (about 1 minute or less) (Exemplary Embodiment 2). The washing with pure water was carried out for about 5 minutes in a pure water overflow tank while ultrasonic waves were applied. When the light irradiation time is short, the negative resist pattern can be visually confirmed after the light irradiation, but the resist is completely removed by the washing. As can be seen from the above, it was discovered that when light irradiation is carried out using an excimer UV lamp, the chemical bonds of the organic negative resist are cleaved from the surface in the film thickness direction to the negative resist transfer surface, and the resist can be easily detached by washing with pure water. It should be noted that when the excimer UV lamp is brought closer to the sample, to a distance of about 1 mm or less, it was confirmed that even if the excimer UV light irradiation time is about 30 seconds, the resist residue is completely removed by the subsequent washing with pure water. It was confirmed in this case that the washing with pure water improves the floating reliability, and that there was no adverse effect on the magnetic characteristics, in some approaches.

Moreover, effective methods for removing the resist residue while preventing oxidation include: washing using hydrogen water in which the dissolved gas in pure water is deaerated beforehand, and then hydrogen is dissolved; washing in which ultrasonic waves are applied to a non-aqueous solution containing isopropyl alcohol or the like instead of pure water; or washing using a jet of argon gas or carbon dioxide gas, etc, in various embodiments.

The total length of the excimer UV lamp used in the investigations is about 300 mm, and this lamp is able to irradiate light onto both surfaces of four hard disk substrates having a 65 mm outline at the same time. It is possible to further increase the number of disks which can be processed by increasing the number of UV lamps or the overall length thereof. Furthermore, by increasing the number of UV lamps and optimizing the time taken for the disks to pass by the irradiation surface of the UV lamp, it is possible to uniformly detach negative resists simply by conveying the samples in one direction. In this there is no need to rotate the samples.

The time used for the light irradiation and conveyance is no more than about 60 seconds in some approaches and therefore if twenty disks are processed at the same time, for example, a production volume of at least 1200 disks per hour can be achieved. It should be noted that a device which can process at least 1200 disks per hour is used as the device for washing after the light irradiation by the excimer UV lamp.

Figure 9:
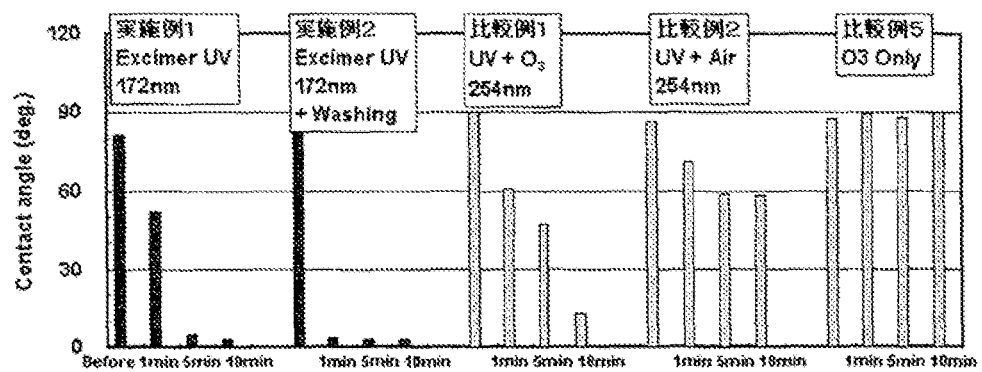
FIG. 9 is a graph showing changes in the contact angle with respect to the time of irradiating UV light in exemplary embodiments according to one embodiment and comparative examples.

FIG. 9 is a graph showing changes in the contact angle with respect to the time of light irradiation produced by various kinds of UV lamp in Exemplary Embodiments 1, 2 and Comparative Examples 1, 2, 5. As shown in Table 1 and FIG. 9, when light is irradiated using a UV lamp with a long wavelength other than an excimer UV lamp, it was confirmed that it was not possible to remove the resist residue in less than 5 minutes (Comparative Examples 1-4). For example, when light was irradiated using a low-pressure mercury UV lamp of wavelength 254 nm, it was not possible to remove the resist residue by light irradiation under the atmosphere or under a vacuum, as shown in Comparative Examples 2, 3, and it was necessary to irradiate light under an ozone atmosphere, as shown in Comparative Example 1. However, even in the case of Comparative Example 1 in which the resist could be detached by light irradiation wider an ozone atmosphere, it was confirmed that the light irradiation time used to detach the resist was at least 10 times greater than the time taken in the case of an excimer UV lamp. In addition, it was only possible to remove the resist residue on the surface layer part, even with the subsequent washing with pure water.

Figure 10:
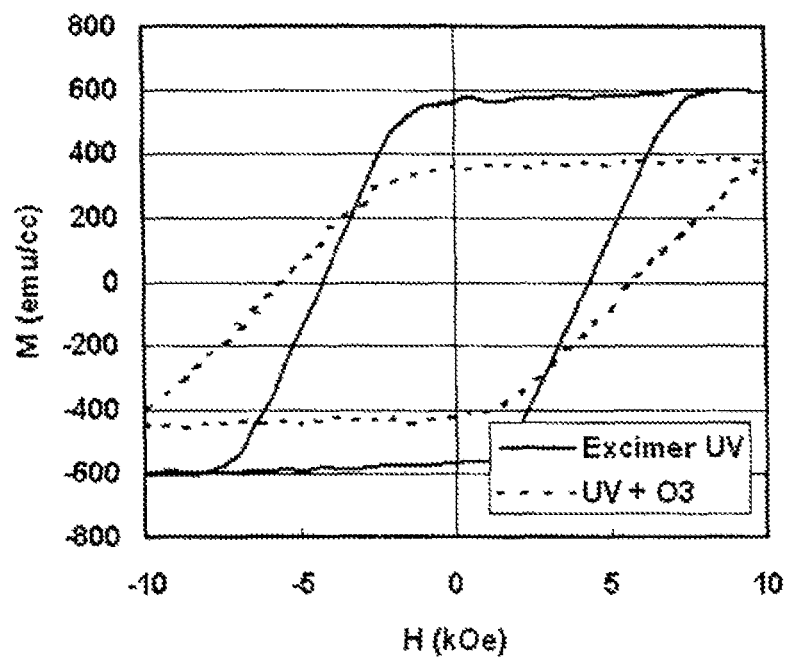
FIG. 10 is a graph showing a hysteresis loop of magnetization with respect to applied magnetic field in exemplary embodiments according to one embodiment and comparative examples.

Furthermore, when the disk is exposed to a high-concentration ozone atmosphere for a long time, there is deterioration of the magnetic characteristics, such as the spread of the magnetization reversal region and a reduction in the amount of magnetization M with respect to the applied magnetic field H as the magnetic film is oxidized, as shown in FIG. 10, and therefore it is not possible to irradiate light by means of a UV lamp under an ozone atmosphere. Furthermore, it is possible to prevent surface oxidation if a protective film made of carbon, silicon, etc., is formed on the surface of the magnetic film, but when the transfer of the pattern to the hard disk progresses by means of reactive ion etching or ion milling, as shown in FIG. 6, the side surface of the magnetic film in the film thickness direction is exposed, and therefore it is not possible to avoid the effects of deterioration of the magnetic characteristics caused by oxidation. In addition, apparatus for producing high-purity ozone gas is required, and the method which employs an excimer UV lamp is superior from the point of view of safety. Furthermore, as shown in Comparative Example 4, when light, is irradiated using a high-pressure mercury UV lamp of wavelength 365 nm, it is not possible to remove the resist residue, even if the light is irradiated under a high-concentration ozone atmosphere.

As shown in Conventional Method 1 in Table 1, it was confirmed that the resist residue could be removed by reactive etching using oxygen gas, which is conventionally employed in fields other than the production of magnetic recording media but when the resist residue was completely removed by means of Conventional Method 1, the magnetic film on which the pattern had been formed was damaged by the etching. Furthermore, when a protective film made of carbon, or silicon etc. was formed, the shape needed for pattern transfer was damaged, and therefor it was not possible to carry out a normal transfer with a pattern width of no more than about 100 nm over the whole surface of the hard disk, something which is a requirement for discrete track-type magnetic recording media, in one embodiment.

Furthermore, as shown in Conventional Method 2 in Table 1, it was confirmed that it was possible to remove the resist residue using a mixed aqueous solution comprising standard sulfuric acid and hydrogen peroxide solution in order to detach the resist of a semiconductor photomask; but in Conventional Method 2, the magnetic film on which the pattern had been formed was damaged by oxidation and corrosion of the processed sample, in the same way as in Conventional Method 1. There was also an increase in surface roughness after processing, and it was not possible to achieve stable floating characteristics for the head at a spacing of no more than about 10 nm over the whole surface. In addition, there are problems in Conventional Method 2 in terms of processing stability, and energy and waste liquid processing costs, which has an effect on the environment, etc., because of the processing involving strong acids at high temperatures of 100° C. or more.

In this way, in both Conventional Methods 1 and 2, the magnetic characteristics of the magnetic film deteriorate after processing, and therefore these methods cannot be used for detaching a negative resist from a discrete track-type magnetic recording medium.

Moreover, it was confirmed visually and from changes in the contact angle in FIG. 9 that it was not possible to remove the resist residue without UV light irradiation, by simply exposing the negative resist to a high-concentration ozone atmosphere (Comparative Example 5), or by cleaning involving the application of ultrasonic waves in ozone water in which high-concentration ozone gas is dissolved in pure water (Comparative Example 6). Furthermore, as shown in Comparative Examples 7-9 in Table 1, it was confirmed that it was not possible to remove the negative resist residue using various kinds of resist-detaching organic solvents which are employed to detach positive-type resists.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A method for removing a resist, the resist being used as a mask as it remains above a pattern after the pattern has been transferred to a surface of a magnetic recording medium having a magnetic film thereon, the method comprising:
   irradiating, with an ultraviolet (UV) light having a wavelength of less than about 240 nm for about one minute or less, a structure having the resist on a surface of the pattern in an atmosphere having oxygen and an ambient pressure,
   wherein the atmosphere is at a temperature of less than about 100° C.

2. The method for removing a resist as recited in claim 1, further comprising cleaning the structure using pure water, after the irradiating.

3. The method for removing a resist as recited in claim 1, further comprising curing the resist to form the pattern which acts as the mask prior to removing the resist by irradiating the resist with a second UV light having a longer wavelength than the UV light having the wavelength of less than about 240 nm.

4. The method for removing a resist as recited in claim 1, wherein the atmosphere includes ozone at a concentration of less than about 1000 ppm.

5. The method for removing a resist as recited in claim 1, wherein the UV light includes single wavelength excimers.

6. The method for removing a resist as recited in claim 5, wherein a source of the UV light uses at least one of Xe, ArBr, KrI, and KrCl.

7. The method for removing a resist as recited in claim 1, further comprising rotating the magnetic recording medium while performing the irradiating.

8. The method for removing a resist as recited in claim 1, wherein the resist is a negative resist.

9. The method as recited in claim 1, with the proviso that reactive on etching is not used to remove an of the resist.

10. A method for forming a magnetic recording medium, the method comprising:
    applying a resist to a surface of a magnetic film above a substrate;
    curing the resist by irradiating the resist with a first ultraviolet (UV) light to form a pattern;
    transferring the pattern to the magnetic film using the pattern as a mask; and
    removing the resist by irradiating using a second UV light having a wavelength of less than about 240 nm and a shorter wavelength than the first UV light for about one minute or less in an atmosphere including oxygen and an ambient pressure,
    wherein the atmosphere is at a temperature of less than about 100° C.

11. The method as recited in claim 10, wherein the atmosphere includes ozone at a concentration of less than about 1000 ppm.

12. The method as recited in claim 10, wherein the second UV light includes single wave length excimers having a wavelength of less than about 240 nm.

13. The method as recited in claim 12, wherein a source of the UV light uses at least one of: Xe, ArBr, KRI, and KrCl.

14. The method as recited in claim 10, wherein the resist is a negative resist.

15. The method as recited in claim 10, with the proviso that reactive ion etching is not used to remove any of the resist.

16. The method as recited in claim 10, further comprising rotating the magnetic recording medium while performing the irradiating.

17. A method for forming a. magnetic recording medium, the method comprising:
    applying a resist to a surface of a magnetic film above a substrate;
    curing the resist by irradiating the resist with a first ultra violet (UV) light to form a pattern;
    transferring the pattern to the magnetic film using the pattern as a mask; and
    removing the resist by irradiating using a second UV light having a shorter wavelength than the first IJV light in an atmosphere including oxygen and an ambient pressure,
    wherein the second UV light has a wavelength of no more than 240 nm,
    wherein the atmosphere is at a temperature of less than about 100° C., with the proviso that reactive ion etching is not used to remove any of the resist, and
    wherein the irradiating to remove the resist using the second UV light is performed for about one minute or less.

* * * * *

UNITED STATES PATENT AND TRADEMARK OFFICE
CERTIFICATE OF CORRECTION

| | |
|---|---|
| PATENT NO. | : 8,679,732 B2 |
| APPLICATION NO. | : 12/820008 |
| DATED | : March 25, 2014 |
| INVENTOR(S) | : Inagaki et al. |

It is certified that error appears in the above-identified patent and that said Letters Patent is hereby corrected as shown below:

In the specification:
col. 1, line 66 replace "fig" with --for--;
col. 2, line 40 replace "as" with --a--;
col. 2, line 59 replace "it" with --in--;
col. 4, line 2 replace "surf cc" with --surface--;
col. 4, line 41 replace "whey" with --when--;
col. 7, line 39 replace "wider" with --under--;
col. 9, line 6 add "1 MHz" before --ultrasonic--;
col. 9, line 41 add "case," before --there--;
col. 9, line 64 replace "wider" with --under--;
col. 10, line 35 replace "therefor" with --therefore--.

In the claims:
col. 12, line 19 replace "wave length" with --wavelength--;
col. 12, line 22 replace "KRI," with --KrI--;
col. 12, line 39 replace "IJV" with --UV--.

Page 1 of 1

Signed and Sealed this
First Day of July, 2014

Michelle K. Lee
*Deputy Director of the United States Patent and Trademark Office*